United States Patent
Jairam et al.

(10) Patent No.: US 7,865,790 B1
(45) Date of Patent: Jan. 4, 2011

(54) ON-CHIP STUCK-AT FAULT DETECTOR AND DETECTION METHOD

(75) Inventors: Prabha Jairam, Fremont, CA (US); Himanshu J. Verma, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 323 days.

(21) Appl. No.: 12/043,825

(22) Filed: Mar. 6, 2008

(51) Int. Cl.
*G01R 31/3177* (2006.01)
*G01R 31/40* (2006.01)

(52) U.S. Cl. ........................ 714/726; 714/733

(58) Field of Classification Search ........................ None
See application file for complete search history.

(56) References Cited

U.S. PATENT DOCUMENTS

| | | | |
|---|---|---|---|
| 6,201,829 B1 | 3/2001 | Schneider | |
| 6,223,314 B1* | 4/2001 | Arabi et al. | 714/726 |
| 7,065,684 B1* | 6/2006 | Chan | 714/700 |
| 7,308,632 B1 | 12/2007 | Verma et al. | |
| 2002/0084797 A1* | 7/2002 | Samaan | 324/765 |
| 2003/0070118 A1* | 4/2003 | Nakao et al. | 714/30 |
| 2005/0235177 A1* | 10/2005 | Ohara et al. | 714/700 |
| 2009/0112557 A1* | 4/2009 | King et al. | 703/15 |

FOREIGN PATENT DOCUMENTS

JP     2001066352 A  *  3/2001

OTHER PUBLICATIONS

U.S. Appl. No. 12/043,833, filed Mar. 6, 2008, Jairam et al.
U.S. Appl. No. 11/498,368, filed Aug. 3, 2006, Jairam et al.

* cited by examiner

*Primary Examiner*—Cynthia Britt
*Assistant Examiner*—Dipakkumar Gandhi
(74) *Attorney, Agent, or Firm*—Pablo Meles; LeRoy D. Maunu

(57) ABSTRACT

An on-chip stuck-at fault detector in an integrated circuit using a test circuit for critical path testing can include a sequence circuit having a first sequential circuit and a second sequential circuit to sensitize the critical path between a source sequential circuit and a destination sequential circuit, an analyzer circuit for capturing an output from the destination sequential circuit and comparing a signal between the destination sequential circuit and the analyzer circuit at predetermined clock cycles, and a controller for strobing the analyzer circuit at the predetermined clock cycles. The first sequence and second circuits can both be initialized to a zero mode (e.g., x=0 and y=0). Thus, no stuck-at faults are determined if the destination sequential circuit and an analyzer sequential circuit in the analyzer circuit have different values and a zero result is captured at a sticky-bit flip flop.

18 Claims, 6 Drawing Sheets x stuck at 1

Initialize x and y to 0;
Expect a 0 at B on 6th or 8th Cycle.
But Get a 1

| Time | x | y | s | d | A | B | CE |
|---|---|---|---|---|---|---|---|
| 0T | 1 | 0 | 0 | 0 | 0 | 0 | 0 |
| 1T | 1 | 1 | 1 | 0 | 0 | 0 | 0 |
| 2T | 1 | 1 | 1 | 1 | 0 | 0 | 0 |
| 3T | 1 | 1 | 1 | 1 | 1 | 0 | 0 |
| 4T | 1 | 1 | 1 | 1 | 1 | 0 | 0 |
| 5T | 1 | 1 | 1 | 1 | 1 | 0 | 1 |
| 6T | 1 | 1 | 1 | 1 | 1 | ①  | 0 |
| 7T | 1 | 1 | 1 | 1 | 1 | 1 | 1 |
| 8T | 1 | 1 | 1 | 1 | 1 | 1 | 0 |

Expect 0

FIG. 3 x net stuck at 1

Initialize x and y to 0;
Expect a 0 at B on 6th or 8th Cycle.
But Get a 1

| Time | x | y | s | d | A | B | CE |
|---|---|---|---|---|---|---|---|
| 0T | 1 | 0 | 0 | 0 | 0 | 0 | 0 |
| 1T | 1 | 1 | 1 | 0 | 0 | 0 | 0 |
| 2T | 0 | 1 | 1 | 1 | 0 | 0 | 0 |
| 3T | 0 | 1 | 1 | 1 | 1 | 0 | 0 |
| 4T | 0 | 1 | 1 | 1 | 1 | 0 | 0 |
| 5T | 0 | 1 | 1 | 1 | 1 | 0 | 1 |
| 6T | 0 | 1 | 1 | 1 | 1 | ①  | 0 |
| 7T | 0 | 1 | 1 | 1 | 1 | 1 | 1 |
| 8T | 0 | 1 | 1 | 1 | 1 | 1 | 0 |

Expect 0

FIG. 4

Initialize x and y to 0;
Expect a 0 at B on 6th or 8th Cycle.
But Get a 1 y stuck at 1

| Time | x | y | s | p | A | B | CE |
|------|---|---|---|---|---|---|----|
| 0T | 0 | 1 | 0 | 0 | 0 | 0 | 0 |
| 1T | 0 | 1 | 0 | 0 | 0 | 0 | 0 |
| 2T | 0 | 1 | 0 | 0 | 0 | 0 | 0 |
| 3T | 0 | 1 | 0 | 0 | 0 | 0 | 0 |
| 4T | 0 | 1 | 0 | 0 | 0 | 0 | 0 |
| 5T | 0 | 1 | 0 | 0 | 0 | 0 | 1 |
| 6T | 0 | 1 | 0 | 0 | 0 | ①| 0 |
| 7T | 0 | 1 | 0 | 0 | 0 | 1 | 1 |
| 8T | 0 | 1 | 0 | 0 | 0 | 1 | 0 |

Expect 0

FIG. 5

Initialize x and y to 0;
Expect a 0 at B on 6th or 8th Cycle.
But Get a 1 y net stuck at 1

| Time | x | y | s | p | A | B | CE |
|------|---|---|---|---|---|---|----|
| 0T | 0 | 0 | 0 | 0 | 0 | 0 | 0 |
| 1T | 0 | 0 | 0 | 0 | 0 | 0 | 0 |
| 2T | 0 | 0 | 0 | 0 | 0 | 0 | 0 |
| 3T | 0 | 0 | 0 | 0 | 0 | 0 | 0 |
| 4T | 0 | 0 | 0 | 0 | 0 | 0 | 0 |
| 5T | 0 | 0 | 0 | 0 | 0 | 0 | 1 |
| 6T | 0 | 0 | 0 | 0 | 0 | ①| 0 |
| 7T | 0 | 0 | 0 | 0 | 0 | 1 | 1 |
| 8T | 0 | 0 | 0 | 0 | 0 | 1 | 0 |

Expect 0

FIG. 6

Scenario if x and y are initialized to 0 and 1;
Expect a 1 at B on 6th Cycle. This test will be used to determine more stuck at faults

| Time | x | y | s | d | A | B | CE |
|---|---|---|---|---|---|---|---|
| 0T | 0 | 1 | 0 | 0 | 0 | 0 | 0 |
| 1T | 0 | 0 | 0 | 0 | 0 | 0 | 0 |
| 2T | 1 | 0 | 0 | 0 | 0 | 0 | 0 |
| 3T | 1 | 1 | 1 | 0 | 0 | 0 | 0 |
| 4T | 0 | 1 | 1 | 1 | 0 | 0 | 0 |
| 5T | 0 | 0 | 0 | 1 | 1 | 0 | 1 |
| 6T | 1 | 0 | 0 | 0 | 1 | 1 | 0 |
| 7T | 1 | 1 | 1 | 0 | 0 | 1 | 1 |
| 8T | 0 | 1 | 1 | 1 | 0 | 1 | 0 |

Expect 1

FIG. 7

OR output net stuck at 0;
Initialize x and y to 0 and 1; Expect a 1 at B on 6th Cycle. Get a 0.

| Time | x | y | s | d | A | B | CE |
|---|---|---|---|---|---|---|---|
| 0T | 0 | 1 | 0 | 0 | 0 | 0 | 0 |
| 1T | 0 | 0 | 0 | 0 | 0 | 0 | 0 |
| 2T | 1 | 0 | 0 | 0 | 0 | 0 | 0 |
| 3T | 1 | 1 | 1 | 0 | 0 | 0 | 0 |
| 4T | 0 | 1 | 1 | 1 | 0 | 0 | 0 |
| 5T | 0 | 0 | 0 | 1 | 1 | 0 | 1 |
| 6T | 1 | 0 | 0 | 0 | 1 | 0 | 0 |
| 7T | 1 | 1 | 1 | 0 | 0 | 0 | 1 |
| 8T | 0 | 1 | 1 | 1 | 0 | 0 | 0 |

Expect 1

FIG. 8

ON-CHIP STUCK-AT FAULT DETECTOR AND DETECTION METHOD

FIELD OF THE INVENTION

The invention relates to integrated circuit devices (ICs). More particularly, the invention relates to a test circuit for verifying a critical path for an IC.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. As used herein, note that the terms "include" and "including" mean including without limitation.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

For purposes of clarity, FPGAs are described below though other types of PLDs may be used. FPGAs may include one or more embedded microprocessors. For example, a microprocessor may be located in an area reserved for it, generally referred to as a "processor block."

The testing of performance of a design instantiated in programmable logic of an FPGA ("FPGA fabric") was premised on fully programmable parts. However, as partially programmable parts may be used for some designs, testing of such designs in an FPGA that is partially programmable has become more problematic. As such, it would be desirable to provide a means for testing a design implemented in a partially programmable FPGA to verify functionality of the programmable logic employed.

SUMMARY OF THE INVENTION

One or more aspects of the invention generally relate to integrated circuits, and more particularly, to testing of integrated circuits.

In accordance with a first embodiment of the invention, an on-chip stuck-at fault detector in an integrated circuit using a test circuit for critical path testing can include a sequence circuit having a first sequential circuit and a second sequential circuit to sensitize the critical path between a source sequential circuit and a destination sequential circuit, an analyzer circuit for capturing an output from the destination sequential circuit and comparing a signal between the destination sequential circuit and the analyzer circuit at predetermined clock cycles, and a controller for strobing the analyzer circuit at the predetermined clock cycles. The first sequence circuit can be initialized to a zero mode and the second sequence circuit can be initialized to a zero mode (e.g., x=0 and y=0). Note, no stuck-at faults are determined if the destination sequential circuit and an analyzer sequential circuit in the analyzer circuit have different values and a zero result is captured at a sticky-bit flip flop.

In accordance with a second embodiment of the invention, an on-chip stuck-at fault detector in an integrated circuit using a test circuit for critical path testing can include a sequence circuit having a first sequential circuit and a second sequential circuit to sensitize the critical path between a source sequential circuit and a destination sequential circuit where the sequence circuit is tested in a first mode and a second mode, an analyzer circuit for capturing an output from the destination sequential circuit and comparing a signal between the destination sequential circuit and the analyzer circuit at predetermined clock cycles, and a controller for strobing the analyzer circuit at the predetermined clock cycles. The first sequential circuit can be initialized to a zero mode and the second sequential circuit can be initialized to a zero mode for the first mode (e.g., x=0 and y=0). Thus, as before, no stuck-at faults are determined if the destination sequential circuit and an analyzer sequential circuit in the analyzer circuit have different values and a zero result is captured at a sticky-bit flip flop. Further, the first sequential circuit can be initialized to a zero mode and the second sequential circuit can be initialized to a one mode for the second mode (e.g., x=0, y=1). In the second mode, no stuck-at faults are determined if the destination sequential circuit and an analyzer sequential circuit in the analyzer circuit have the same values and a one result is captured at the sticky-bit flip flop.

In accordance with a third embodiment of the invention, a method of on-chip stuck-at fault detection in an integrated circuit using a test circuit for critical path testing can include the steps of generating a data signal using a sequence circuit having a first sequence circuit and a second sequence circuit to sensitize a critical path between a source sequential circuit and a destination sequential circuit, capturing an output from the destination sequential circuit at an analyzer circuit, comparing a signal between the destination sequential circuit and the analyzer circuit at predetermined clock cycles, and strobing the analyzer circuit at the predetermined clock cycles. The method can further initialize the first sequence to a zero mode and initialize the second sequence circuit to a zero mode. The method then can determine no stuck-at faults if the destination sequential circuit and an analyzer sequential circuit in the analyzer circuit have different values and a zero result is captured at a sticky-bit flip flop.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 3-6 are time tables illustrating various stuck-at fault scenarios when x and y are both initialized to 0 in accordance with an embodiment of the present invention.

FIGS. 7-8 are time tables illustrating various stuck-at fault scenarios when x is initialized to 0 and y is initialized to 1 in accordance with an embodiment of the present invention.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Embodiments of the present invention are applicable to many types of integrated circuits, especially those including programmable logic. However, examples of some embodiments of the present invention are described in relation to application in Field Programmable Gate Arrays (FPGAs). These exemplary descriptions are not intended to limit embodiments of the present invention, but to illuminate them in the context of very complex integrated circuits.

Figure 1:
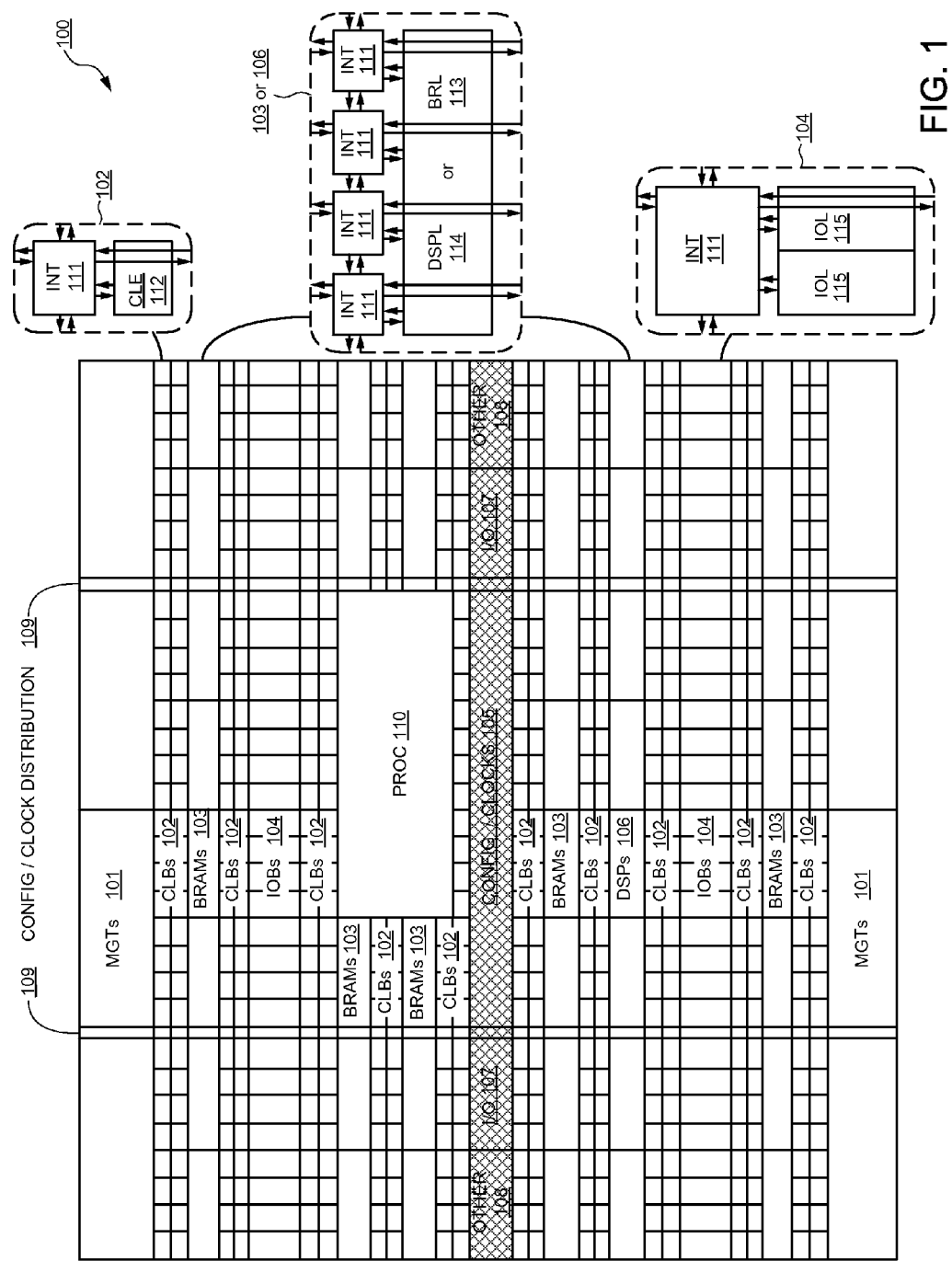
FIG. 1 is a simplified block diagram depicting an exemplary embodiment of a columnar Field Programmable Gate Array ("FPGA") architecture in which one or more aspects of the invention may be implemented.

By way of example, FIG. 1 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output ports (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110.

In some FPGAs, each programmable tile includes a programmable interconnect element (INT) 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element (CLE) 112 that can be programmed to implement user logic plus a single programmable interconnect element 111. A BRAM 103 can include a BRAM logic element (BRL 113) in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown crosshatched in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the right of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
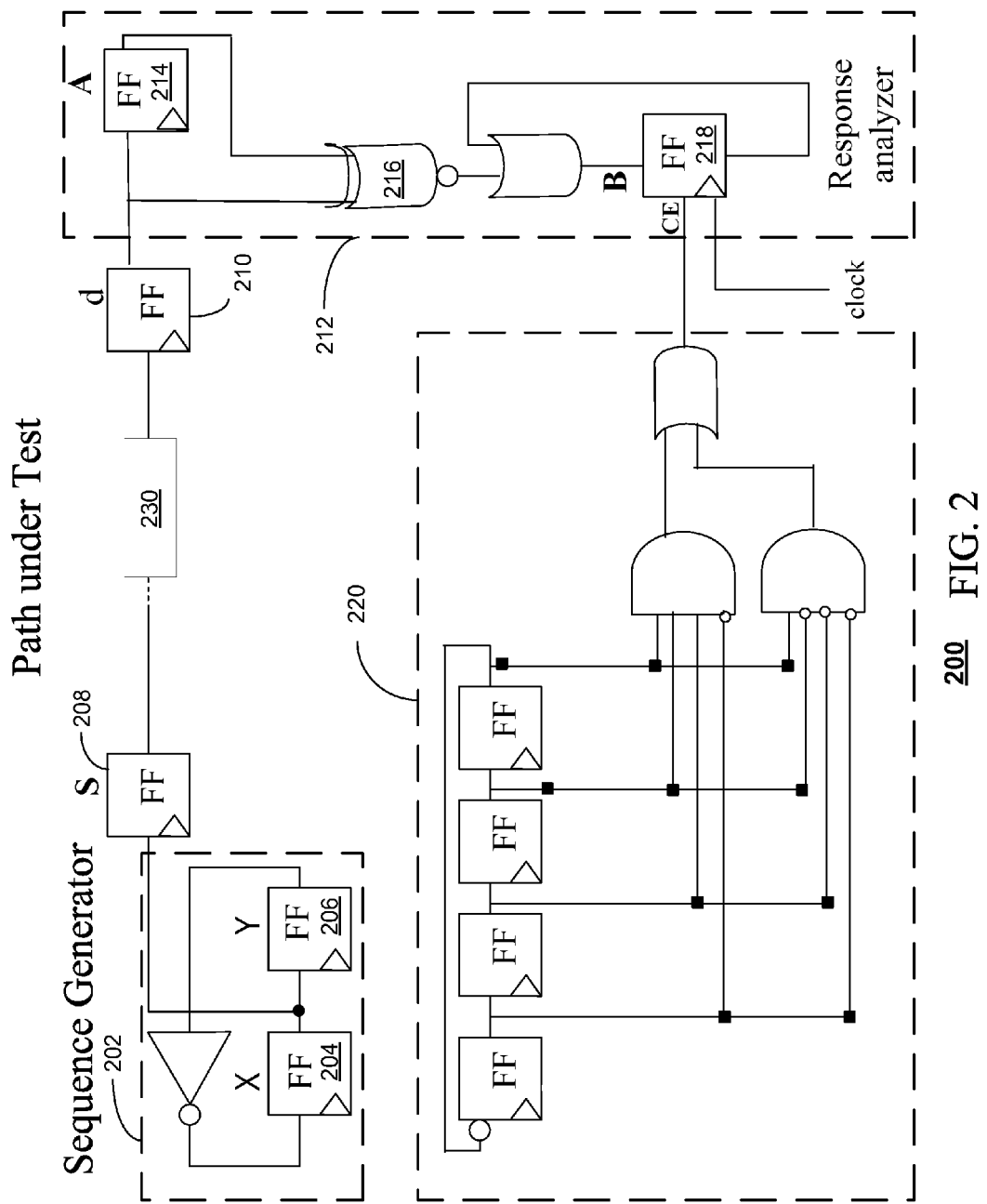
FIG. 2 is a block/schematic diagram depicting an exemplary embodiment of a test jig for determining stuck-at faults under various conditions

Referring to FIG. 2, a test circuit in an integrated circuit 200 is used for verifying a critical path of a circuit under test 230. As is known, a "critical path" is generally considered a speed-limiting path with respect to a frequency of operation of a user design. The test circuit here is used to test a user design "critical path". The critical path can include a source sequential circuit 208, the circuit under test 230 as well as a destination sequential circuit 210. The sequential circuits described here can be flip flops. Thus, the user design critical path starts with a flip-flop and ends with a flip-flop and such flip-flops as well as combinational logic in the form of a user design circuit (230), may be in programmable logic of an FPGA and, more particularly, may be within FPGA fabric, or one or more IOBs, or any combination thereof. For example, a series of gates may be considered more than one logic level. Combinational logic in the circuit under test 230 may be one or more levels of combinational logic. Notably, none of the circuitry in combinational logic includes clocked circuits such as flip-flops, namely sequential circuits.

As is known, a design may be tested using static timing analysis. Static timing analysis may be used to identify a critical path. Notably, there may be more than one critical path within a design to be tested. However, for purposes of clarity and not limitation, only a single critical path is described with reference to FIG. 2. The test circuit can include a sequence generator 202 generating a data signal for the critical path, the source sequential circuit 208 for receiving the data signal coupled to an input of the critical path, the destination sequential circuit 210 for receiving an output of the critical path, and an analyzer circuit 212 for verification of timing of the critical path. The sequence generator 202 can be a clock divide by 4 counter, for example, that generates the data signal for the critical path. In general, any form of circuit capable of providing a test pattern as one or more data inputs may be used. The test circuit can further include a controller circuit 220 for strobing a comparison circuit 218 in the analyzer circuit at a predetermined clock time. The controller circuit 220 and all other sequential components can be clocked using digital clock manager (DCM) clocked at a frequency predicted by a static timing analysis tool. Other clocking devices or methods can be used (including external automatic test equipment (ATE) timing devices) to clock or strobe the comparison circuit 218 and the embodiments herein are not necessarily limited to using a DCM.

In current testing techniques, a test circuit and method for the critical path would include the generation of a stuck-at test pattern for each block and each net of the test circuit that includes the fault grading and testing on a tester prior to the running of the critical path test. Such a technique takes a significant amount of tester time for testing each critical path. Instead, the stuck-at faults in the test circuit can be tested using the same test circuit used for critical path testing where one test on the tester determines up to 100% of any stuck-at faults on the nets and blocks of the test circuit. This technique can considerably reduce tester time.

As noted above, the same circuit used for testing the critical path timing can be used for testing stuck-at faults. The sequencer 202, which is made up of two flip flops x (204) and y (206) and is essentially a divide by 4 counter, produces a data signal to sensitize the critical path which starts at the source flip flop or source sequential circuit 208 and ends at the destination flip flop or destination sequential circuit 210. The analyzer flip flop 214 captures the signal from the destination flip flop 210 and an XNOR gate 216 compares the signals between the destination flip flop 210 and the analyzer flip flop 214 at predetermined clock cycles. The controller circuit 220 strobes or provides an assertion value for the predetermined clock cycles when the comparison between signals are to be made.

The stuck-at fault test can be made in a single mode where the flip flops x and y (204 and 206 respectively) are both set to zero. For a more thorough test to obtain up to 100% stuck-at fault coverage, the stuck-at fault test can be made in two modes in a single test on the tester. In other words, the stuck-at fault test can be made in a first mode where the flip flops x and y (204 and 206 respectively) are both set to zero and in a second mode where the flip flop x (204) is set to 0 and the flip flop y (206) is set to 1. Thus, a single test using two modes can detect all the stuck-at faults in the test circuit of the critical path test to avoid a false-positive for the critical path test due to a stuck-at fault in the test circuit.

The stuck-at fault test in the first mode (where x and y both equal 0) is passed when the destination flip flop 210 (*d*) and the analyzer flip flop 214 (A) have different values and the result of 0 is captured in a sticky-bit flip flop 218 (B). A stuck-at fault test in the first mode fails or flags an error when the destination flip flop 210 and the analyzer flip flop 214 have the same values resulting in a 1 in the sticky-bit flip flop 218. The stuck-at fault test in the second mode (where x is initialized to 0 and y is initialized to 1) is passed when the destination flip flop 210 (*d*) and the analyzer flip flop 214 (A) have the same values and the result of 1 is captured in the sticky-bit flip flop 218 (B). The stuck-at fault test in the second mode fails or flags an error when the destination flip flop 210 and the analyzer flip flop 214 have different values resulting in a 0 in the sticky-bit flip flop 218. A stuck-at fault in some parts of the test circuit would cause the destination flip flop 210 and the analyzer flip flop 214 to have different values resulting in a 0 in the sticky-bit flip flop 218. Note, the sequencer flip flops x and y can be initialized to 0 and 1 respectively by asserting a Global Set/Reset (GSR) at the beginning of the test.

Referring to FIG. 2 and FIGS. 3-6, time tables are shown illustrating various stuck-at fault scenarios when x and y are both initialized to 0. In FIG. 3, the time table illustrates the scenario where x is stuck at 1 and where a 0 is expected at B or the sticky flip flop 218 on a $6^{th}$ or a $8^{th}$ cycle, but B results in a 1. In FIG. 4, the time table illustrates the scenario where x net is stuck at 1 and where a 0 is expected at B or the sticky flip flop 218 on a $6^{th}$ or a $8^{th}$ cycle, but B results in a 1 resulting in an error. In FIG. 5, the time table illustrates the scenario where y is stuck at 1 and where a 0 is expected at B or the sticky flip flop 218 on a $6^{th}$ or a $8^{th}$ cycle, but B results in a 1. In FIG. 6, the time table illustrates the scenario where y net is stuck at 1 and where a 0 is expected at B or the sticky flip flop 218 on a $6^{th}$ or a $8^{th}$ cycle, but B results in a 1. There are numerous other scenarios where a similar error can be flagged where x and y are initialized to 0 and a 0 is expected at B on a $6^{th}$ or $8^{th}$ cycle, but a 1 is detected resulting in an error. Such scenarios include x stuck at 0, x net stuck at 0, y stuck at 0, y net stuck at 0, A stuck at 1, d net stuck at 1, A stuck at 0, d net stuck at 0, A net stuck at 1, and the OR output net stuck at 1 (see OR gate above B flip flop in FIG. 2).

Referring to FIG. 2 and FIGS. 7 and 8, time tables are shown illustrating various stuck-at fault scenarios when x is initialized to 0 and y is initialized to 1. The time table in FIG. 7 illustrates an example where the stuck-at fault test passes where a 1 is expected at B (the sticky flip flop 218) on the $6^{th}$ cycle. In FIG. 8, the time table illustrates where the OR output net is stuck at 0 where a 1 is expected at B on the $6^{th}$ cycle, but the test provides a 0. This flags an error. There are numerous other scenarios where a similar error can be flagged where x is initialized to 0 and y is initialized to 1 and a 1 is expected at B on a $6^{th}$ or $8^{th}$ cycle, but a 0 is detected resulting in an error. For example, where B is stuck at 0 or when CE (the clock enable signal from the controller 220 to the sticky bit flip flop 218) is stuck at 0.

Note, the critical path tests are run at critical path frequencies and at fail frequencies. Further note that the failures can be binned or categorized as controller or DCM locked pin failure, sticky-bit (B) failure when the x and y sequencer flip flops are both set to 0 and sticky-bit (B) failure when x is set to 0 and y is set to 1. The part can be rejected if any failure is reported or if the last two tests fail.

Figure 9:
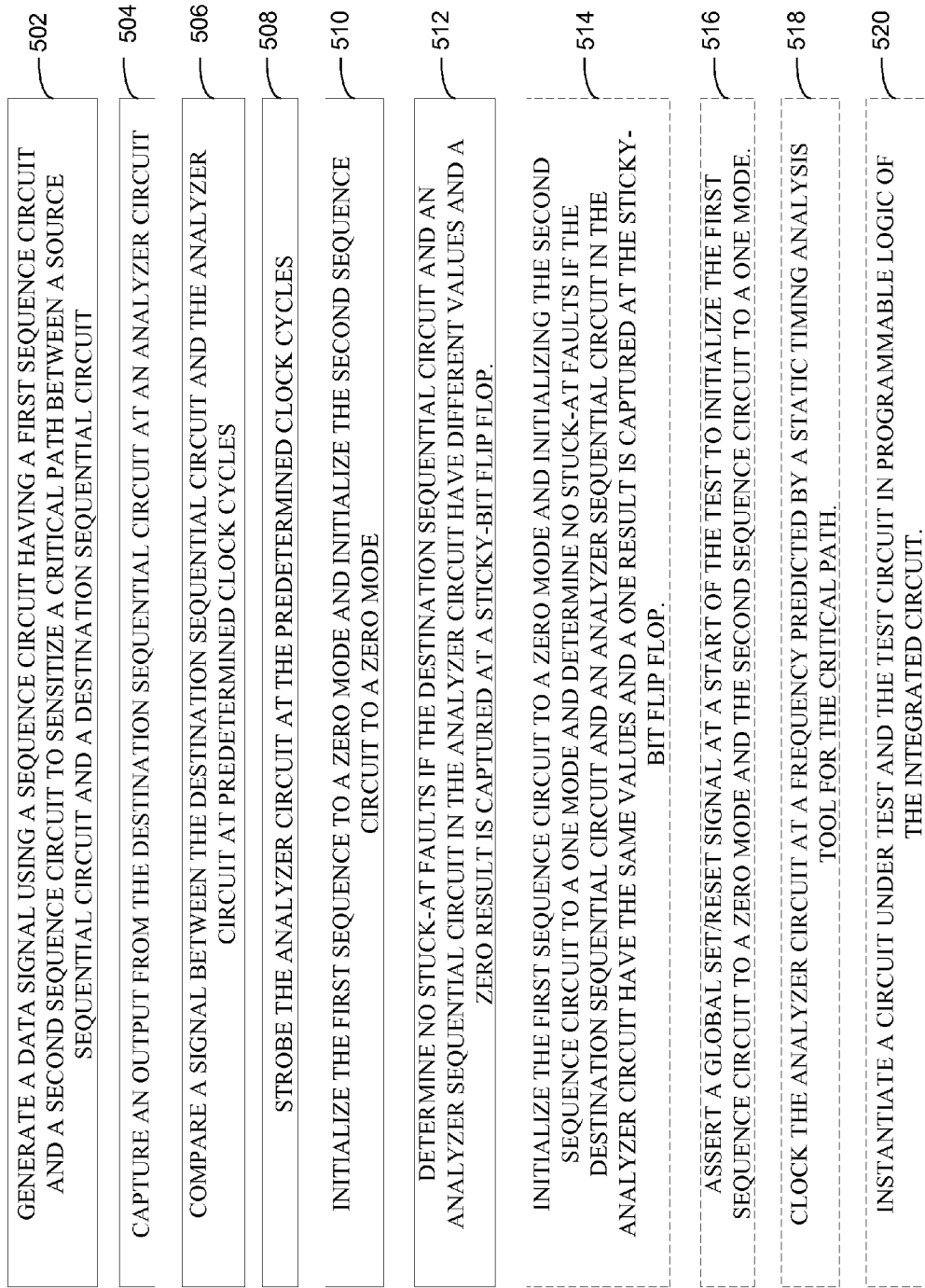
FIG. 9 is a flow chart illustrating a method of detecting stuck-at fault of a critical path of a circuit under test in accordance with an embodiment of the present invention.

Referring to FIG. 9, a flow chart illustrating a method 500 of on-chip stuck-at fault detection in an integrated circuit using a test circuit for critical path testing. The method can include the step 502 of generating a data signal using a sequence circuit having a first sequence circuit and a second sequence circuit to sensitize a critical path between a source sequential circuit and a destination sequential circuit, capturing an output from the destination sequential circuit at an analyzer circuit at step 504, comparing a signal between the destination sequential circuit and the analyzer circuit at predetermined clock cycles at step 506, and the step 508 of strobing the analyzer circuit at the predetermined clock cycles. The method 500 can further initialize the first sequence to a zero mode and initialize the second sequence circuit to a zero mode at step 510. The method then can determine no stuck-at faults at step 512 if the destination sequential circuit and an analyzer sequential circuit in the analyzer circuit have different values and a zero result is captured at a sticky-bit flip flop.

Optionally, the method 500 can further include the step 514 of initializing the first sequence circuit to a zero mode and initializing the second sequence circuit to a one mode and determine no stuck-at faults if the destination sequential circuit and an analyzer sequential circuit in the analyzer circuit have the same values and a one result is captured at the sticky-bit flip flop. The step of initializing the first sequence circuit to a zero mode and the second sequence circuit to a one mode is done at step 516 by asserting a Global Set/Reset (GSR) signal at a start of the test. Note, this is not the same as the signal at the set/reset (sr) pin of the destination sequential circuit. The method 500 can also clock the analyzer circuit at a frequency predicted by a static timing analysis tool for the critical path at step 518. The method can also instantiate a circuit under test and the test circuit in programmable logic of the integrated circuit at step 520.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps.

What is claimed is:

1. An on-chip stuck-at fault detector in an integrated circuit using a test circuit for critical path testing, comprising:
   a sequence circuit having a first sequential circuit and a second sequential circuit, the sequence circuit being enabled to sensitize the critical path between a source sequential circuit and a destination sequential circuit;
   wherein the sequence circuit includes an output coupled to an input of the source sequential circuit;
   an analyzer circuit including an analyzer sequential circuit having an input coupled to the output of the destination sequential circuit and enabled to capture an output from the destination sequential circuit in the analyzer sequential circuit, the analyzer circuit configured to compare a signal output from the destination sequential circuit and a signal output from the analyzer sequential circuit at predetermined clock cycles;
   a controller configured to enable storage of value in a sticky-bit flip flop in the analyzer circuit at the predetermined clock cycles;
   wherein the first sequential circuit is initialized to a zero mode and the second sequential circuit is initialized to a zero mode; and
   wherein no stuck-at faults are determined to be present in the sequence circuit in response to the analyzer circuit determining that the signals output from the destination sequential circuit and the analyzer sequential circuit have different values during the predetermined clock cycles, and the analyzer circuit further configured to store a zero result in the sticky-bit flip flop in response to the signals output from the destination sequential circuit and the analyzer circuit having different values during the predetermined clock cycles; and
   wherein a stuck-at fault is determined to be present in the sequence circuit in response to the analyzer circuit determining that the signals output from the destination sequential circuit and the analyzer sequential circuit have equal values, and the analyzer circuit further configured to store a one result in the sticky-bit flip flop in response to the signals output from the destination sequential circuit and the analyzer circuit having equal values during the predetermined clock cycles.

2. The detector of claim 1, wherein:
   the first sequential circuit is initialized to a zero mode and the second sequential circuit is initialized to a one mode and wherein no stuck-at faults are determined to be present in the sequence circuit in response to the analyzer circuit determining that the signals output from the destination sequential circuit and the analyzer sequential circuit have the same values during the predetermined clock cycles, and the analyzer circuit further configured to store a one result in the sticky-bit flip flop in response to determining that the signals output from the destination sequential circuit and the analyzer sequential circuit have the same values during the predetermined clock cycles; and
   a stuck-at fault is determined to be present in the sequence circuit in response to the analyzer circuit determining that the signals output from the destination sequential circuit and the analyzer sequential circuit have the different values during the predetermined clock cycles, and the analyzer circuit further configured to store a zero result in the sticky-bit flip flop in response to determining that the signals output from the destination sequential circuit and the analyzer sequential circuit have the different values during the predetermined clock cycles.

3. The detector of claim 2, wherein the first sequential circuit is initialized to a zero mode and the second sequential circuit is initialized to a one mode by asserting a Global Set/Reset signal at a start of the test.

4. The detector of claim 1, wherein the analyzer circuit is clocked at a frequency predicted by a static timing analysis tool for the critical path.

5. The detector of claim 1, wherein a circuit under test and the test circuit are instantiated in programmable logic of the integrated circuit.

6. The detector of claim 1, wherein a circuit under test and the test circuit are clocked using a digital clock manager clocked at a frequency predicted by a static timing analysis tool.

7. The detector of claim 1, wherein a circuit under test and the test circuit are clocked using an automated test equipment device.

8. The detector of claim 1, wherein the first sequential circuit, the second sequential circuit, the destination sequential circuit, the source sequential circuit, and the analyzer sequential circuit are each flip-flops.

9. An on-chip stuck-at fault detector in an integrated circuit using a test circuit for critical path testing, comprising:

a sequence circuit having a first sequential circuit and a second sequential circuit, the sequence circuit being enabled to sensitize the critical path between a source sequential circuit and a destination sequential circuit, wherein the sequence circuit is tested in a first mode and a second mode;

wherein the sequence circuit includes an output coupled to an input of the source sequential circuit;

an analyzer circuit including an analyzer sequential circuit having an input coupled to the output of the destination sequential circuit and enabled to capture an output from the destination sequential circuit in the analyzer sequential circuit, the analyzer circuit configured to compare a signal output from the destination sequential circuit and a signal output from the analyzer sequential circuit at predetermined clock cycles;

a controller configured to enable storage of value in a sticky-bit flip flop in the analyzer circuit at the predetermined clock cycles;

wherein the first sequential circuit is initialized to a zero mode and the second sequential circuit is initialized to a zero mode for the first mode;

wherein no stuck-at faults are determined to be present in the sequence circuit in response to the analyzer circuit determining that the signals output from the destination sequential circuit and the analyzer sequential circuit have different values during the predetermined clock cycles, and the analyzer circuit further configured to store a zero result in a sticky-bit flip flop in response to the signals output from the destination sequential circuit and the analyzer circuit having different values during the predetermined clock cycles; and wherein the first sequential circuit is initialized to a zero mode and the second sequential circuit is initialized to a one mode for the second mode wherein no stuck-at faults are determined to be present in the sequence circuit in response to the analyzer circuit determining that the signals output from the destination sequential circuit and the analyzer sequential circuit have the same values during the predetermined clock cycles, and the analyzer circuit further configured to store a one result in the sticky-bit flip flop in response to determining that the signals output from the destination sequential circuit and the analyzer sequential circuit have the same values during the predetermined clock cycles.

10. The detector of claim 9, wherein the first sequential circuit is initialized to a zero mode and the second sequential circuit is initialized to a one mode by asserting a Global Set/Reset signal at a start of the test.

11. The detector of claim 9, wherein the analyzer circuit is clocked at a frequency predicted by a static timing analysis tool for the critical path.

12. The detector of claim 9, wherein a circuit under test and the test circuit are instantiated in programmable logic of the integrated circuit.

13. The detector of claim 9, wherein a circuit under test and the test circuit are clocked using a digital clock manager clocked at a frequency predicted by a static timing analysis tool or are clocked using an automated test equipment device.

14. The detector of claim 9, wherein the first sequential circuit, the second sequential circuit, the destination sequential circuit, the source sequential circuit, and the analyzer sequential circuit are each flip-flops.

15. A circuit for verifying stuck-at faults, comprising:
a critical path including a source storage element for receiving an input to the critical path and a destination storage element for receiving an output from the critical path;
a sequence generator having an output coupled to an input of the source storage element, the sequence generator configured to sensitize the critical path with input values to the source storage element;
an analyzer circuit including an analyzer storage element having an input coupled to output of the destination storage element, the analyzer circuit configured to generate a comparison result as a function of output of the destination storage element, output of the analyzer storage element, and output of a sticky-bit storage element, and to store the comparison result in the sticky-bit storage element;
a controller coupled to the sticky-bit storage element, the controller configured to enable storage of the comparison result in the sticky-bit storage element at selected clock cycles; and
wherein a stuck-at fault in the sequence generator is indicated by a value of the comparison result in the sticky-bit storage element resulting from:
initialization of the sequence generator with a first set of values,
the sequence generator outputting a first sequence of values to the source storage element as a function of the first set of values, and
the output of the destination storage element being equal to the output of the analyzer storage element during the selected clock cycles.

16. The circuit of claim 15, wherein:
no stuck-at fault is indicated as being present in the sequence generator by a value of the comparison result in the sticky-bit storage element resulting from:
initialization of the sequence generator with the first set of values,
the sequence generator outputting the first sequence of values to the source storage element as a function of the first set of values, and
the output of the destination storage element being not equal to the output of the analyzer storage element during the selected clock cycles.

17. The circuit of claim 15, wherein a stuck-at fault in the sequence generator is indicated by a value of the comparison result in the sticky-bit storage element resulting from:
initialization of the sequence generator with a second set of values,
the sequence generator outputting a second sequence of values to the source storage element as a function of the second set of values, and
the output of the destination storage element being not equal to the output of the analyzer storage element during the selected clock cycles.

18. The circuit of claim 17, wherein:
no stuck-at fault is indicated as being present in the sequence generator by a value of the comparison result in the sticky-bit storage element resulting from:
initialization of the sequence generator with the second set of values,
the sequence generator outputting the second sequence of values to the source storage element as a function of the first set of values, and
the output of the destination storage element being equal to the output of the analyzer storage element during the selected clock cycles.

* * * * *